(12) United States Patent
Hashiguchi et al.

(10) Patent No.: US 9,352,511 B2
(45) Date of Patent: May 31, 2016

(54) METHOD FOR PRODUCING MULTILAYER FILM

(75) Inventors: Shinji Hashiguchi, Izumiotsu (JP);
Terunori Yamaguchi, Izumiotsu (JP);
Kazutaka Hirano, Izumiotsu (JP)

(73) Assignee: STELLA CHEMIFA CORPORATION, Osaka-Shi (JP)

( * ) Notice: Subject to any disclaimer, the term of this patent is extended or adjusted under 35 U.S.C. 154(b) by 455 days.

(21) Appl. No.: 13/322,877

(22) PCT Filed: Jun. 2, 2010

(86) PCT No.: PCT/JP2010/059307
§ 371 (c)(1),
(2), (4) Date: Nov. 28, 2011

(87) PCT Pub. No.: WO2010/140603
PCT Pub. Date: Dec. 9, 2010

(65) Prior Publication Data
US 2012/0070669 A1  Mar. 22, 2012

(30) Foreign Application Priority Data

Jun. 4, 2009  (JP) ................. 2009-135243

(51) Int. Cl.
*B32B 37/00* (2006.01)
*B29C 65/00* (2006.01)
(Continued)

(52) U.S. Cl.
CPC .............. *B29C 66/026* (2013.01); *B29C 66/45* (2013.01); *B32B 7/10* (2013.01); *B32B 27/16* (2013.01);
(Continued)

(58) Field of Classification Search
CPC ........ B29C 66/026; B29C 66/028; C09J 5/02; B32B 38/008; B32B 38/0008; B32B 27/16; B32B 27/306; H01L 31/04; H01L 31/048; H01L 31/049

USPC .......... 156/308.6, 308.8, 272.6, 273.3, 272.2, 156/281, 308.2, 309.3, 324.4
See application file for complete search history.

(56) References Cited

U.S. PATENT DOCUMENTS 5,900,321 A * 5/1999 Carstens et al. ............... 428/457
6,013,374 A   1/2000 Watanabe et al.
(Continued)

FOREIGN PATENT DOCUMENTS

JP   03-126734 A   5/1991
JP   06177412 A * 6/1994
(Continued)

OTHER PUBLICATIONS

Machine translation of JP 11204811 date unknown.*
(Continued)

*Primary Examiner* — John Goff
(74) *Attorney, Agent, or Firm* — Law Office of Katsuhiro Arai (57) ABSTRACT

An object of the invention is to provide a method for producing a laminated film comprising at least two resin films bonded together, which is capable of increasing the adhesiveness of the bonding surface and forming a laminated film with high reliability. The method for producing a laminated film according to the invention comprising at least two resin films laminated together, which comprises: a fluorination treatment step comprising bringing a fluorine and oxygen atoms-containing treatment gas into contact with at least a partial region of the surface of at least one of the two resin films to increase the adhesiveness of the region; and a bonding step comprising bonding the two resin films together using, as a bonding surface, the surface that has been brought into contact with the treatment gas.

5 Claims, 2 Drawing Sheets

(51) Int. Cl.
| | |
|---|---|
| *B32B 38/00* | (2006.01) |
| *B32B 7/10* | (2006.01) |
| *B32B 27/16* | (2006.01) |
| *B32B 27/30* | (2006.01) |
| *B32B 27/32* | (2006.01) |
| *C09J 5/02* | (2006.01) |
| *H01L 31/048* | (2014.01) |
| *B29K 23/00* | (2006.01) |
| *B29K 27/12* | (2006.01) |
| *B29K 33/00* | (2006.01) |
| *B29K 67/00* | (2006.01) |
| *B29K 69/00* | (2006.01) |
| *B29K 79/00* | (2006.01) |
| *B29C 65/48* | (2006.01) |

(52) U.S. Cl.
CPC ........... *B32B 27/304* (2013.01); *B32B 27/306* (2013.01); *B32B 27/308* (2013.01); *B32B 27/322* (2013.01); *B32B 38/0008* (2013.01); *C09J 5/02* (2013.01); *H01L 31/048* (2013.01); *B29C 65/48* (2013.01); *B29C 65/482* (2013.01); *B29C 65/484* (2013.01); *B29C 65/4825* (2013.01); *B29C 65/4835* (2013.01); *B29C 66/71* (2013.01); *B29K 2023/00* (2013.01); *B29K 2023/083* (2013.01); *B29K 2027/12* (2013.01); *B29K 2033/12* (2013.01); *B29K 2067/00* (2013.01); *B29K 2067/006* (2013.01); *B29K 2069/00* (2013.01); *B29K 2079/08* (2013.01); *B32B 2270/00* (2013.01); *B32B 2457/12* (2013.01); *C09J 2203/322* (2013.01); *C09J 2400/226* (2013.01); *C09J 2400/228* (2013.01); *C09J 2431/006* (2013.01); *Y02E 10/50* (2013.01); *Y10T 428/3154* (2015.04); *Y10T 428/31507* (2015.04); *Y10T 428/31544* (2015.04); *Y10T 428/31721* (2015.04); *Y10T 428/31786* (2015.04); *Y10T 428/31797* (2015.04); *Y10T 428/31928* (2015.04)

(56) References Cited

U.S. PATENT DOCUMENTS

| | | | |
|---|---|---|---|
| 6,462,142 | B1 | 10/2002 | Hobbs et al. |
| 2002/0153038 | A1* | 10/2002 | Umemoto et al. ............ 136/251 |
| 2006/0118988 | A1* | 6/2006 | Louw et al. ..................... 264/82 |
| 2006/0220354 | A1* | 10/2006 | Geltinger et al. .......... 280/728.3 |
| 2008/0023063 | A1* | 1/2008 | Hayes .................. H01L 31/048 136/251 |
| 2009/0101204 | A1* | 4/2009 | Levy ................. B32B 37/0053 136/256 |
| 2011/0086230 | A1 | 4/2011 | Takano et al. |

FOREIGN PATENT DOCUMENTS

| | | | |
|---|---|---|---|
| JP | 09-227705 | A | 9/1997 |
| JP | 10-261387 | A | 9/1998 |
| JP | 11204811 | A * | 7/1999 |
| JP | 2001-181422 | A | 7/2001 |
| JP | 2002-194125 | A | 7/2002 |
| JP | 2006-036848 | A | 2/2006 |
| JP | 2010-024446 | A | 2/2010 |
| WO | 2009/154252 | A | 12/2009 |

OTHER PUBLICATIONS

Patent Examination Report No. 1 issued by the Australian Patent Office, mailed Feb. 4, 2013, for Australian counterpart application No. 2010255001.

* cited by examiner

METHOD FOR PRODUCING MULTILAYER FILM

This application is the U.S. National Phase under 35 U.S.C. §371 of International Application PCT/JP2010/059307, filed Jun. 2, 2010, which claims priority to Japanese Patent Application No. 2009-135243, filed Jun. 4, 2009. The International Application was published under PCT Article 21(2) in a language other than English.

TECHNICAL FIELD

The invention relates to a method for producing a laminated film comprising resin films that have undergone fluorination treatment and are laminated together.

BACKGROUND ART

Materials for use in solar battery back sheets include fluororesin films such as polyvinyl fluoride (PVF) films, aluminum foil laminates, and aluminum or Si vapor deposited polyethylene terephthalate (PET) films, which are for improving weather resistance and gas barrier properties. Such back sheets protect, from water vapor, solar battery cells which are sensitive to humidity.

Among the above back sheet materials, fluororesin films are superior in terms of long-term durability. Therefore, demand for fluororesin films as back sheet materials has been increasing. Unfortunately, materials made of fluororesins, which have generally C—F bonds, have the problem that they have low surface energy and show water repellency/oil repellency and therefore are less adhesive.

Examples of techniques for improving the adhesiveness of such fluororesin films include plasma discharge treatment, corona discharge treatment, flame treatment, and blast treatment. These surface modification techniques introduce a hydrophilic functional group (such as a —COOH, —OH, $SO_3H$, or $SO_2F_x$ group) onto the resin surface to improve the adhesiveness.

However, such treatment methods need a large-scale apparatus and therefore increase production cost. They also have the problem that the modified surface significantly degrade over time and therefore cannot maintain the bonding capability over a long term.

On the other hand, Patent Document 1 listed below discloses a surface modification method that comprises: selecting a synthetic or natural polymer material having a specific gravity of 1.6 or less and having no ether, carbonate, amide, or urethane bond; and bringing the synthetic or natural polymer material into contact with a mixed gas composed of fluorine gas and a type of gas containing oxygen element so that hydrophilicity is imparted to the material.

Unfortunately, this conventional technique is not applicable to resins with a specific gravity of about 1.6 to 2.2. This is because synthetic or natural polymer materials with a specific gravity of more than 1.6 have a well-developed crystal structure and therefore resist diffusion of fluorine gas so that the function of surface modification is not well developed.

PRIOR ART DOCUMENT

Patent Document

Patent Document 1: Japanese Patent Application Laid-Open (JP-A) No. 2002-194125.

SUMMARY OF THE INVENTION

Problems to be Solved by the Invention

The invention has been made in view of the above problems, and an object of the invention is to provide a method for producing a laminated film comprising at least two resin films bonded together, which is capable of increasing the adhesiveness of the bonding surface and forming a laminated film with high reliability. Another object of the invention is to provide a solar battery back sheet comprising the laminated film obtained by such a production method.

Means for Solving the Problems

To solve the conventional problems, the inventors have made studies on laminated film producing methods and solar battery back sheets. As a result, the invention has been completed based on the finding that the objects can be achieved using the features described below.

Thus, the resin film producing method according to the invention to solve the above problems is a method for producing a laminated film comprising at least two resin films laminated together, which comprises: a fluorination treatment step comprising bringing a fluorine and oxygen atoms-containing treatment gas into contact with at least a partial region of the surface of at least one of the two resin films to increase the adhesiveness of the region; and a bonding step comprising bonding the two resin films together using, as a bonding surface, the surface that has been brought into contact with the treatment gas.

According to this method, the fluorination treatment step comprises bringing fluorine and oxygen atoms-containing treatment gas into contact with a resin film so that the adhesiveness of its surface is increased. The bonding step also comprises bonding it to another resin film using, as a bonding surface, the surface having increased adhesiveness. In this way, the adhesiveness of the bonding surface is successfully increased by the fluorination treatment of the bonding surface, which makes it possible to produce a highly reliable laminated film. The fluorination treatment allows the preservation of high adhesiveness even after a lapse of long time (standing) in contrast to conventional plasma, corona, flame, or blast treatment, so that degradation over time can be suppressed. In addition, the surface modification of the resin film can be easily achieved in a short time, so that production cost can be reduced.

In an embodiment of the invention, one of the resin films is preferably an ethylene-vinyl acetate copolymer film, and in the bonding step, the other resin film is preferably bonded using no adhesive.

In an embodiment of the invention, the bonding step is preferably performed using an adhesive.

In an embodiment of the invention, the resin film used to form the laminated film is preferably at least one selected from the group consisting of a fluororesin film, a poly(methyl methacrylate) film, a polyethylene terephthalate film, a polyethylene naphthalate film, a polybutylene terephthalate film, a polycyclohexanedimethanol terephthalate film, a polycarbonate film, an ethylene-vinyl acetate copolymer film, a polyolefin-based film, a polyvinyl butyral film, and a polyimide film.

Also in an embodiment of the invention, the resin film preferably contains an additional resin component having a reactive group that is reactive with the treatment gas. This can further enhance the fluorination treatment and further increase the adhesiveness.

The solar battery back sheet according to the invention to solve the above problems comprises a laminated film obtained by the laminated film producing method stated above.

The adhesiveness of the resin film or films is increased by the fluorination treatment, and therefore, the films are successfully bonded together to form a laminated film. This laminate is also useful as a solar battery back sheet. The adhesiveness performance imparted by the treatment can be maintained over long term, which is superior in terms of process control, so that product reliability can be improved.

Effects of the Invention

The invention produces the advantageous effects as described below by the means described above.

Specifically, according to the invention, fluorine and oxygen atoms-containing treatment gas is brought into contact with the bonding surface of one of at least two resin films to be bonded, so that the adhesiveness of the surface is increased, and therefore, the adhesiveness is successfully increased during the bonding to the other resin film. The fluorination treatment can suppress degradation of the adhesiveness over time in contrast to conventional plasma, corona, flame, or blast treatment. Therefore, even after a lapse of long time (standing), high adhesiveness can be maintained. As a result, production of a highly reliable laminated film is made possible. The surface modification is also easily performed in a short time, so that production efficiency can be improved and production cost can also be reduced. In addition, the laminated film obtained by the production method of the invention is typically suitable for use in solar battery back sheets.

EMBODIMENTS FOR CARRYING OUT THE INVENTION

According to an embodiment of the invention, the method for producing a laminated film comprises at least: a fluorination treatment step comprising performing fluorination treatment on at least one of at least two resin films; and a bonding step comprising bonding the two resin films together using, as a bonding surface, the surface that has been brought into contact with the treatment gas.

The fluorination treatment step is intended to increase adhesiveness by performing fluorination treatment on the surface of the resin film. While it is not clear why the fluorination treatment can increase adhesiveness, it is considered that the fluorination treatment can roughen the surface of the resin film to increase the so-called anchor effect, and can introduce substituents contributable to adhesion (specifically, —COOH group, —COF group, etc.), so that adhesiveness can be increased. The fluorination treatment step may be performed on all of the resin films to be laminated or on any one of them. In this step, the region to be brought into contact with the treatment gas is preferably the whole of the bonding surface of the resin film. It will be understood that the invention is not restricted to this mode, and in another mode of the invention, at least a partial region of the surface of the resin film may only be subjected to the surface modification. In this case, partial surface modification of the resin film may be performed through masking the desired region of the surface of the resin film. The masking may be performed using any masking material having heat resistance to the treatment temperature or higher, examples of which include materials made of fluororesin such as polytetrafluoroethylene, polytetrafluorochloroethylene, polyvinyl fluoride, polyvinylidene fluoride, polydichlorodifluoroethylene, or polytrifluorochloroethylene, and materials made of ceramics, polyimide, or polyether ether ketone (PEEK).

The treatment gas may be any mixed gas containing a fluorine atom and an oxygen atom. Examples of the fluorine atom-containing gas include, but are not limited to, hydrogen fluoride (HF), fluorine ($F_2$), chlorine trifluoride ($ClF_3$), sulfur tetrafluoride ($SF_4$), boron trifluoride ($BF_2$), and nitrogen trifluoride ($NF_3$). These gases may be used alone or in any combination of two or more.

In the fluorination treatment step, the concentration of the fluorine atom-containing gas is typically in the range of 0.001 to 99 vol %. It should be noted that even a small amount of the fluorine atom-containing gas can be sufficiently effective. In view of production cost and safety, therefore, the concentration may be typically set to 0.001 to 50 vol %, more preferably 0.001 to 10 vol %.

Examples of the oxygen atom-containing gas include, but are not limited to, oxygen gas ($O_2$), sulfur dioxide gas ($SO_2$), and carbonyl fluoride ($COF_2$). These gases may be used alone or in any combination of two or more.

In the fluorination treatment step, the concentration of the oxygen atom-containing gas is typically in the range of 0.001 to 99 vol %. It should be noted that even a small amount of the oxygen atom-containing gas can be sufficiently effective. Also in view of production cost, therefore, the gas concentration is preferably low, and for example, it is specifically from 0.01 to 50 vol %, more preferably from 0.1 to 20 vol %.

The mixed gas can also be sufficiently effective at a low concentration. In view of production cost and safety, therefore, dry air or inert gas such as nitrogen, argon, helium, neon, krypton, or xenon is preferably added as a third component for dilution.

While the fluorination treatment time is not restricted, the reaction between the resin film and the treatment gas explosively proceeds at the early stage of the reaction. Therefore, the effect of increasing the adhesiveness can be produced by the treatment for a relatively short period of time. Specifically, for example, the treatment time is in the range of 1 second to 600 minutes, preferably 1 second to 100 minutes, more preferably 1 second to 30 minutes. If the treatment time is more than 100 minutes, the fluorination may proceed too much so that the adhesiveness may decrease.

While the fluorination treatment temperature is not restricted, it is preferably in the range of −50° C. to 150° C., more preferably 0° C. to 100° C. taking into account the heat resistance temperature of the resin films (if an additive is contained, the heat resistance temperature of the additive should be taken into account).

The resin film may be a single layer or a laminated structure in which at least two films are laminated. For example, the thickness of the resin film (the total thickness in the case of a laminated structure) is preferably, but not limited to, in the range of 1 to 1,000 μm, more preferably in the range of 5 to 750 μm. In this case, the resin films to be bonded may be different in thickness from one another. The planar shape of the resin films are also not restricted and may be appropriately selected as needed.

Examples of the resin films include, but are not limited to, fluororesin films, poly(methyl methacrylate) (PMMA) films, polyethylene terephthalate (PET) films, polyethylene naphthalate (PEN) films, polybutylene terephthalate (PBT) films, polycyclohexanedimethanol terephthalate (PCT) films, polycarbonate (PC) films, ethylene-vinyl acetate copolymer (EVA) films, polyolefin-based films, polyvinyl butyral (PVB) films, and polyimide (PI) films.

Specific examples of the fluororesin films include films made of one or more of polyvinylidene fluoride (PVDF), polyvinyl fluoride (PVF), polychlorotrifluoroethylene (PCTFE), ethylene-chlorotrifluoroethylene copolymer (ETCFE), ethylene-tetrafluoroethylene copolymer (ETFE), and so on.

When an ethylene-vinyl acetate copolymer film is used as the resin film, the film generally contains an organic peroxide. When such an organic peroxide is thermally decomposed, an adhesive function is provided to the surface of the ethylene-vinyl acetate copolymer film. Therefore, an ethylene-vinyl acetate copolymer film is used, the use of an adhesive may be omitted from the bonding step. Examples of the organic peroxide that may be added include, but are not limited to, tert-butylperoxy-2-ethylhexylcarbonate, 2,5-dimethylhexane-2,5-dihydroperoxide, 2,5-dimethyl-2,5-di(tert-butylperoxy)hexane-3, di-tert-butylperoxide, dicumyl peroxide, 2,5-dimethyl-2,5-di(tert-butylperoxy)hexane, α,α'-bis(tert-butylperoxyisopropyl)benzene, n-butyl-4,4-bis(tert-butylperoxy)butane, 2,2-bis(tert-butylperoxy)butane, 1,1-bis(tert-butylperoxy)cyclohexane, 1,1-bis(tert-butylperoxy)3,3,5-trimethylcyclohexane, tert-butylperoxybenzoate, and benzoyl peroxide.

The content of the organic peroxide is preferably, but not limited to, in the range of 0.1 to 10% by weight, more preferably in the range of 0.1 to 5% by weight, based on the total weight of the ethylene-vinyl acetate copolymer film. If the content is less than 0.1% by weight, sufficient adhesiveness may fail to be obtained even after the fluorination treatment. On the other hand, if the content is more than 10% by weight, the properties of the ethylene-vinyl acetate copolymer may fail to be maintained.

When a fluororesin film is used as the resin film, the fluorination treatment may fail to impart sufficient adhesiveness. In such case, an alloyed two-layer structure film may be used. For example, the front surface side film may have a PVDF/PMMA ratio of 70/30, and the rear surface side film may have a PVDF/PMMA ratio of 30/70. The fluorination treatment is more effective for PMMA than for PVDF, a fluororesin, and even when a simple PVDF film has an insufficient adhering strength, the addition of PMMA makes it possible to form a film having a sufficient adhering strength.

The fluororesin film preferably contains an additional resin component. The additional resin component may be of any type having, in the molecular structure, a functional group reactive with the treatment gas. When such an additional resin component is contained, the fluorine atom-containing gas can react with the reactive functional group so that the fluorination treatment can be enhanced. This makes possible a further improvement in adhesiveness.

Examples of the functional group reactive with the treatment gas include a nitrogen-containing group, a silicon-containing group, an oxygen-containing group, a phosphorus-containing group, a sulfur-containing group, a hydrocarbon group, and a halogen-containing group. Examples of the nitrogen-containing group include an amide group and an amino group. Examples of the silicon-containing group include a trialkylsilyl group, a silyl ether group, and a —Si(CH$_3$)$_2$O— group. Examples of the oxygen-containing group include an ester group, a carbonate group, and an ether group. Examples of the phosphorus-containing group include a phosphorylcholine group and the like. Examples of the sulfur-containing group include a sulfo group and a sulfonyl group. Examples of the hydrocarbon group include a methyl group, a methylene group, and a phenyl group. Examples of the halogen-containing group include a —CHX— group, a —CHX$_2$ group, a —CX$_2$ group, and a —CX$_2$— group (wherein X represents at least one selected from the group consisting of F, Cl, Br, and I atoms).

More specifically, examples of the additional resin component include poly(methyl methacrylate) (PMMA), polyethylene terephthalate (PET), polyethylene naphthalate (PEN), polybutylene terephthalate (PBT), polycyclohexanedimethanol terephthalate (PCT), polycarbonate (PC), and polyolefin. These resin components may be used alone or in any combination of two or more. The additional resin component is also preferably other than the polymer compounds listed as component materials for the fluororesin film.

The amount of the resin that may be added is preferably, but not limited to, in the range of 0.1 to 90% by weight, more preferably in the range of 0.1 to 80% by weight, based on the total weight of the fluororesin film. If the content is more than 90% by weight, the performance of the fluororesin itself may fail to be maintained.

After the fluorination treatment, the resin film may be cleaned with a cleaning liquid such as water or alcohol. This makes it possible to remove unreacted F$_2$, which adsorbs on the surface of the resin film, and HF, which is produced by the reaction, so that an adhering surface with high stability can be formed.

The bonding step comprises bonding at least two resin films together using the fluorination-treated surface as a bonding surface to form a laminated film. The bonding may be performed using an adhesive. However, when one of the resin films to be boned together is an ethylene-vinyl acetate copolymer film, they can be bonded together with no adhesive.

The adhesive that may be used is typically, but not limited to, a urethane adhesive, an epoxy adhesive, a synthetic rubber adhesive, or the like. A pressure sensitive adhesive (pressure-sensitive adhesive) may also be used. The pressure-sensitive adhesive that may be used is typically, but not limited to, an acrylic pressure-sensitive adhesive, a rubber pressure-sensitive adhesive, a urethane pressure-sensitive adhesive, or the like.

When a urethane adhesive, an epoxy adhesive, a synthetic rubber adhesive, or the like is used as the adhesive, the laminate after the bonding may be subjected to heat-pressure bonding. In this case, the heating temperature is preferably in the range of 20 to 200° C., more preferably in the range of 25 to 150° C. The pressure is preferably in the range of 0.1 to 500 kPa, more preferably in the range of 0.1 to 200 kPa. The pressure bonding time is preferably in the range of 1 minute to 24 hours, depending on the type of the adhesive. The pressure bonding may be performed while pressing is performed by pressing means such as a pressure bonding roller.

The bonding method may be appropriately changed depending on the type of the adhesive used. For example, in the case of a liquid adhesive, the method may include applying the adhesive to at least one of the resin films, then bonding them together, and drying the adhesive. In this case, the amount of the application may be appropriately set depending on the thickness of the adhesive layer to be obtained after the drying. In the case of a film-shaped adhesive, the method may include bonding the adhesive to at least one of the resin films to be laminated and then bonding them together.

When an adhesive is used, all the bonding surfaces of the resin films to be bonded together are preferably subjected to the fluorination treatment. This can further improve the adhesion of them as compared with the case where a resin film having undergone the fluorination treatment and a resin film not having undergone the fluorination treatment are bonded together to form a laminated film.

When one of the resin films to be bonded together is an ethylene-vinyl acetate copolymer film and when the bonding is performed with no adhesive, heat-pressure bonding is preferably performed. In this case, the heating temperature is preferably in the range of 50 to 200° C., more preferably in the range of 100 to 150° C. The pressure is preferably in the range of 0.1 to 500 kPa, more preferably in the range of 0.1 to 101.3 kPa. The pressure bonding time is preferably in the range of 10 seconds to 24 hours, more preferably in the range of 10 seconds to 60 minutes. The pressure bonding may be performed while pressing is performed by pressing means such as a pressure bonding roller. It may also be performed using a vacuum laminator.

Figure 1:
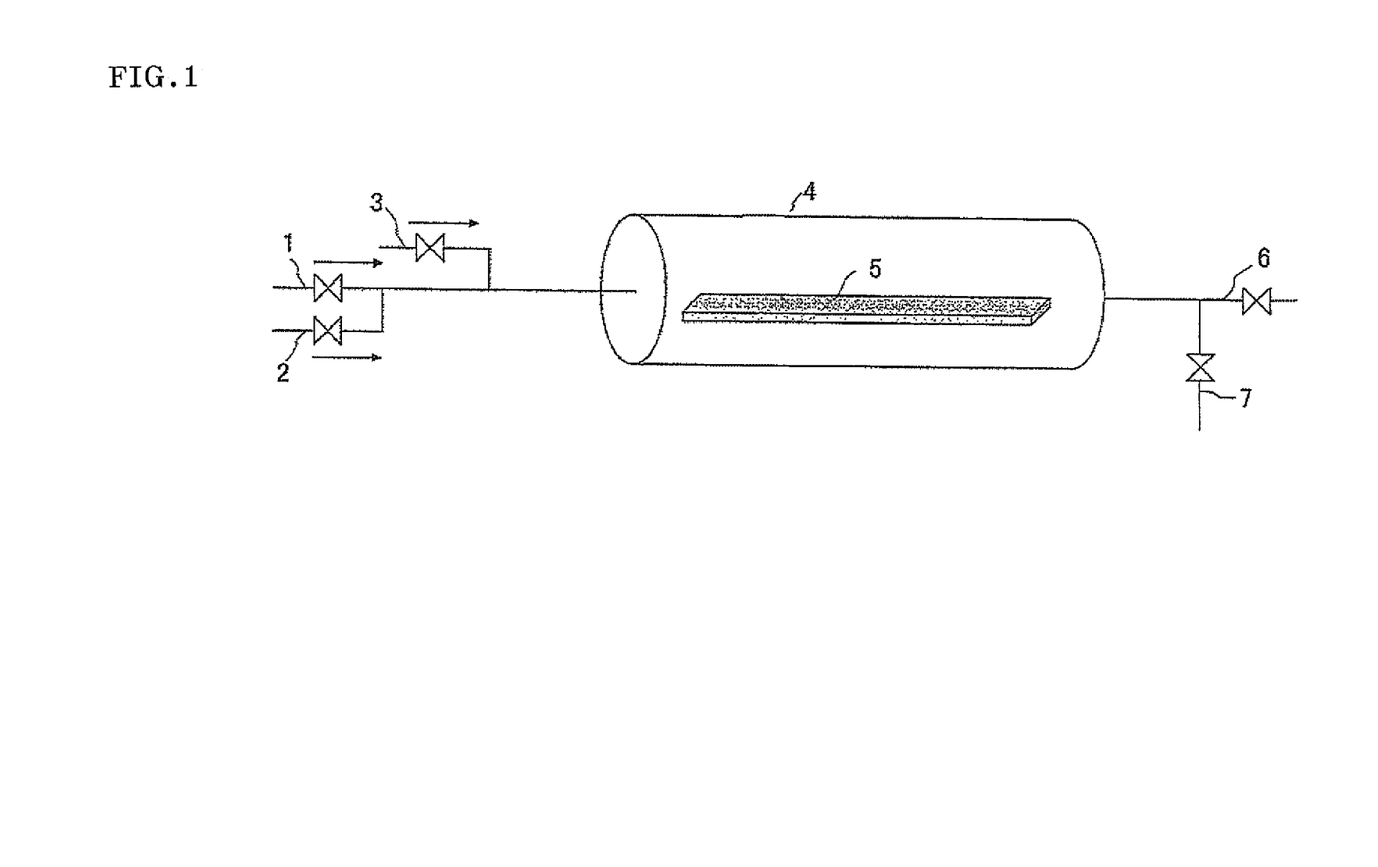
FIG. 1 is a schematic diagram showing an exemplary apparatus for use in the laminated film producing method according to an embodiment of the invention.

In an embodiment of the invention, for example, the fluorination treatment step may be performed using the reaction apparatus shown in FIG. 1. Specifically, a reaction vessel 4 for performing the fluorination treatment of a resin film is provided, and a resin film 5 is placed in the reaction vessel 4. The reaction vessel 4 is not restricted, and for example, a reaction vessel made of stainless steel, aluminum, nickel, or the like may be used.

Subsequently, when the pressure in the reaction vessel is reduced, a valve in a vacuum line 7 is opened for evacuation, and after a predetermined pressure (for example, 10 Pa) or less is reached, the valve in the vacuum line 7 is closed.

Subsequently, as necessary, valves in a first supply line 1 for supplying a fluorine atom-containing gas, a second supply line 2 for supplying an oxygen atom-containing gas, and a third supply line 3 for supplying an inert gas are appropriately opened so that a treatment gas with the concentration adjusted to the desired level is introduced into the reaction vessel 4.

As a result, the treatment gas is brought into contact with the resin film 5 so that the fluorination treatment of the resin film 5 is performed. The adhesiveness of the resin film 5 after the fluorination treatment can be controlled by appropriately setting the concentration of the treatment gas, the treatment time, the treatment temperature, and the gas flow rate as needed. It should be noted that when the resin film 5 has a large surface area, the treatment conditions and the reaction vessel to be used should be suitable for the large area. The reaction may be performed under normal, increased, or reduced pressure, while the treatment gas is continuously supplied, or the reaction may be performed under atmospheric, increased, or reduced pressure in the hermetically sealed vessel.

The concentration of the fluorine atom-containing gas in the treatment gas can be controlled by the amount of the gas supplied from each of the first to third supply lines 1 to 3.

While the flow rate of the treatment gas flowing in the reaction vessel 4 is not restricted, a too high gas flow rate may cause an explosive reaction. Therefore, at the early stage of the reaction, it is important to appropriately set the concentration of the fluorine atom-containing gas and the flow rate. In other words, the concentration and the flow rate may be appropriately increased or decreased depending on to what extent the reaction proceeds. The gas flow rate may also be appropriately set depending on the size of the reaction vessel 4 and the shape of the resin film 5.

After the fluorination treatment is completed, only the vale in the third supply line 3 among the gas supply lines is opened to introduce an inert gas, and the treatment gas in the reaction vessel 4 is replaced with the inert gas at a given flow rate. In this process, a valve in an exhaust line 6 is also opened. Subsequently, the valves in the third supply line 3 and the exhaust line 6 are closed, the valve in the vacuum line 7 is opened, and the reaction vessel 4 is evacuated to a predetermined pressure (for example, 10 Pa) or less.

Subsequently, the valve in the vacuum line 7 is closed, the valve in the third line 3 is opened, and an inert gas is introduced until the atmospheric pressure is reached. When the pressure in the reaction vessel 4 reaches the atmospheric pressure, the valve in the exhaust line 6 is opened, and the resin film 5 having undergone the fluorination treatment is taken out.

Figure 2:
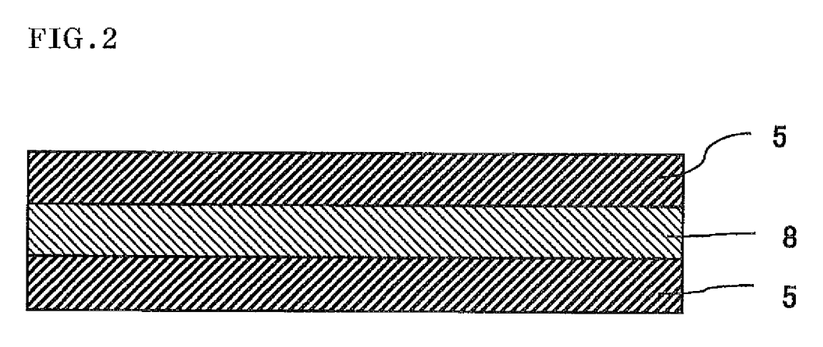
FIG. 2 is a schematic cross-sectional view schematically showing a solar battery back sheet having the laminated film.

The resin film 5 obtained by the method described above has high adhesiveness and therefore is suitable for use in a solar battery back sheet or the like. For example, it may be used in a solar battery back sheet in such a way as shown in FIG. 2. Specifically, the resin films 5 are bonded to both surfaces of a resin film 8 with an adhesive interposed therebetween. The resin films 5 have gas barrier properties for water vapor, oxygen gas, etc. In this case, the resin films 5, which have undergone the fluorination treatment as described above, have good adhesiveness. As a result, a solar battery back sheet with high reliability is successfully produced.

EXAMPLES

Hereinafter, preferred examples of the invention are illustratively described in detail. It will be understood that the materials, the amounts, and so on described in the examples are not intended to limit the scope of the invention, unless otherwise specified.

Example 1

In this example, a multilayer film was used as the resin film 5. The multilayer film was an alloyed two-layer structure film, in which the front surface side film was controlled to have a PVDF/PMMA ratio of 70/30, and the rear surface side film was controlled to have a PVDF/PMMA ratio of 30/70. The multilayer film was introduced into the reaction vessel 4. The valve in the vacuum line 7 was opened, and the pressure in the reaction vessel 4 was reduced to 10 Pa or less.

Subsequently, the valve in the vacuum line 7 was closed, and the valves in the first supply line 1 for supplying fluorine gas, the second supply line 2 for supplying oxygen gas, and the third supply line 3 for supplying nitrogen gas (inert gas) were opened at the same time. A treatment gas (mixed gas), in which fluorine gas/nitrogen gas/oxygen gas was controlled to be 0.5/4.5/95 (in volume ratio) and to provide a total flow rate of 1.0 L/minute, was introduced into the reaction vessel 4 until the atmospheric pressure was reached. The valves in the first supply line 1, the second supply line 2, and the third supply line 3 were simultaneously closed so that the reaction vessel was hermetically sealed, and the sealed state was maintained as it was for 300 seconds. The temperature in the reaction vessel 4 was also kept at 30° C. After a lapse of a predetermined time, the valves in the third supply line 3 for supplying nitrogen gas and the exhaust line 6 were opened, and the mixed gas of fluorine gas/nitrogen gas/oxygen gas in the reaction vessel 4 was replaced with nitrogen gas at a flow rate of 20 L/minute. Subsequently, the valves in the third line 3 and the exhaust line 6 were closed, the valve in the vacuum line 7 was opened, and the pressure in the reaction vessel was reduced to 10 Pa or less.

Subsequently, after the valve in the vacuum line 7 was closed, the valve in the third supply line 3 was opened, and nitrogen gas was introduced at a flow rate of 1.0 L/minute into the reaction vessel 4 until the atmospheric pressure was reached. After the pressure in the reaction vessel 4 reached the atmospheric pressure, the valve in the exhaust line 6 was opened, and the multilayer film after the treatment was taken out.

The obtained multilayer film was washed with UPW (ultra-pure water) under stirring at room temperature for 1 hour. After the washing, UPW on the surface was blown off with nitrogen gas, and then the film was dried under reduced pressure at room temperature until the pressure was reduced to 10 Pa or less. The dried multilayer sheet and an untreated ethylene-vinyl acetate copolymer film (manufactured by Kyoei Kako Co., Ltd.) were bonded together by heat-pressure bonding using the surface of the front surface side film (PVDF: PMMA=70:30) as the bonding surface. The bonding was performed by pressure bonding under the conditions of a temperature of 135° C. and a pressure of 2.5 kPa for 30 minutes. Subsequently, the product was taken out of the apparatus and allowed to cool naturally. Thus, a laminated film according to this example was obtained.

Examples 2 to 7

In Examples 2 to 7, laminated films according to Examples 2 to 7 were prepared as in Example 1, except that the fluorination treatment was performed under the conditions shown in Table 1 below. In Example 6, the treatment gas used was composed only of fluorine gas and oxygen gas, and therefore, the valve in the third supply line 3 was closed when the treatment gas was introduced into the reaction vessel 4.

Comparative Example 1

In this comparative example, a multilayer film and an ethylene-vinyl acetate copolymer film were bonded together as in Example 1, except that the multilayer film, which was the same as used in Example 1, was not subjected to the fluorination treatment, so that a laminated film according to this comparative example was obtained.

Examples 8 and 9

In Examples 8 and 9, laminated films according to Examples 8 and 9 were prepared as in Example 1, except that a PVDF film was used as the resin film and that the fluorination treatment was performed under the conditions shown in Table 2 below.

Comparative Example 2

In this comparative example, a PVDF film and an ethylene-vinyl acetate copolymer film were bonded together as in Example 1, except that the PVDF film, which was the same as used in Example 8, was not subjected to the fluorination treatment, so that a laminated film according to this comparative example was obtained.

TABLE 2

| | | Fluorination treatment conditions | | | | Peel |
|---|---|---|---|---|---|---|
| | Resin film | Gas type | Concentration (vol %) | Temperature (° C.) | Time (sec) | strength (N/cm) |
| Example 8 | PVDF | $F_2/N_2/O_2$ | 0.5/4.5/95 | 30 | 10 | 2.0 |
| Example 9 | | | | | 300 | 4.0 |
| Comparative Example 2 | PVDF | — | — | — | — | 0.3 |

Examples 10 and 11

In Examples 10 and 11, laminated films according to Examples 10 and 11 were prepared as in Example 1, except that a PVF film (Tedlar (trade name), 50 μm in thickness, manufactured by DuPont) was used as the resin film and that the fluorination treatment was performed under the conditions shown in Table 3 below.

Comparative Example 3

In this comparative example, a PVF film and an ethylene-vinyl acetate copolymer film were bonded together as in Example 1, except that the PVF film, which was the same as used in Example 10, was not subjected to the fluorination treatment, so that a laminated film according to this comparative example was obtained.

TABLE 1

| | | Fluorination treatment conditions | | | | Peel strength (N/cm) |
|---|---|---|---|---|---|---|
| | Resin film | Gas type | Concentration (vol %) | Temperature (° C.) | Time (sec) | |
| Example 1 | PVDF/PMMA | $F_2/N_2/O_2$ | 0.5/4.5/95 | 30 | 300 | 5.5 |
| Example 2 | | | | | 5 | 1.7 |
| Example 3 | | | | | 10 | 1.9 |
| Example 4 | | | | | 600 | 5.5 |
| Example 5 | | | | 100 | 10 | 5.0 |
| Example 6 | | | 1.0/0/99 | 30 | 10 | 7.1 |
| Example 7 | | | 0.5/79.5/20 | 30 | 300 | 5.4 |
| Comparative Example 1 | PVDF/PMMA | — | — | — | — | 0.5 |

TABLE 3

| | | Fluorination treatment conditions | | | |
|---|---|---|---|---|---|
| | Resin film | Gas type | Concentration (vol %) | Temperature (° C.) | Time (sec) | Peel strength (N/cm) |
| Example 10 | PVF | $F_2/N_2/O_2$ | 0.5/4.5/95 | 100 | 10 | >20.0 |
| Example 11 | | | | 30 | 300 | >20.0 |
| Comparative Example 3 | PVF | — | — | — | — | 0.6 |

Note: The header has 7 logical columns (Resin film, Gas type, Concentration, Temperature, Time, Peel strength).

| | Resin film | Gas type | Concentration (vol %) | Temperature (° C.) | Time (sec) | Peel strength (N/cm) |
|---|---|---|---|---|---|---|
| Example 10 | PVF | $F_2/N_2/O_2$ | 0.5/4.5/95 | 100 | 10 | >20.0 |
| Example 11 | | | | 30 | 300 | >20.0 |
| Comparative Example 3 | PVF | — | — | — | — | 0.6 |

Examples 12 and 13

In Examples 12 and 13, laminated films according to Examples 12 and 13 were prepared as in Example 1, except that a PET film (LUMIRROR S-10 (trade name), 50 μm in thickness, manufactured by TORAY INDUSTRIES, INC.) was used as the resin film and that the fluorination treatment was performed under the conditions shown in Table 4 below.

Comparative Example 4

In this comparative example, a PET film and an ethylene-vinyl acetate copolymer film were bonded together as in Example 1, except that the PET film, which was the same as used in Example 12, was not subjected to the fluorination treatment, so that a laminated film according to this comparative example was obtained.

TABLE 4

| | Resin film | Gas type | Concentration (vol %) | Temperature (° C.) | Time (sec) | Peel strength (N/cm) |
|---|---|---|---|---|---|---|
| Example 12 | PET | $F_2/N_2/O_2$ | 0.5/4.5/95 | 30 | 10 | >25.0 |
| Example 13 | | | | | 300 | >25.0 |
| Comparative Example 4 | PET | — | — | — | — | 2.9 |

Examples 14 and 15

In Examples 14 and 15, laminated films according to Examples 14 and 15 were prepared as in Example 1, except that an ETFE film (Neoflon (trade name), 50 μm in thickness, manufactured by DAIKIN INDUSTRIES, Ltd.) was used as the resin film and that the fluorination treatment was performed under the conditions shown in Table 5 below.

Comparative Example 5

In this comparative example, an ETFE film and an ethylene-vinyl acetate copolymer film were bonded together as in Example 1, except that the ETFE film, which was the same as used in Example 14, was not subjected to the fluorination treatment, so that a laminated film according to this comparative example was obtained.

TABLE 5

| | Resin film | Gas type | Concentration (vol %) | Temperature (° C.) | Time (sec) | Peel strength (N/cm) |
|---|---|---|---|---|---|---|
| Example 14 | ETFE | $F_2/N_2/O_2$ | 0.5/4.5/95 | 30 | 10 | 1.8 |
| Example 15 | | | | | 300 | 2.0 |
| Comparative Example 5 | ETFE | — | — | — | — | 0.05 |

Example 16

In Example 16, a laminate film according to Example 16 was prepared as in Example 1, except that a PI film (Kapton (trade name), 45 μm in thickness, manufactured by DuPont) was used as the resin film and that the fluorination treatment was performed under the conditions shown in Table 6 below.

Comparative Example 6

In this comparative example, a PI film and an ethylene-vinyl acetate copolymer film were bonded together as in Example 1, except that the PI film, which was the same as used in Example 16, was not subjected to the fluorination treatment, so that a laminated film according to this comparative example was obtained.

TABLE 6

| | Resin film | Gas type | Concentration (vol %) | Temperature (° C.) | Time (sec) | Peel strength (N/cm) |
|---|---|---|---|---|---|---|
| Example 16 | PI | $F_2/N_2/O_2$ | 0.5/4.5/95 | 30 | 300 | 15.0 |
| Comparative Example 6 | PI | — | — | — | — | 5.0 |

Example 17

In Example 17, an ETFE film (Neoflon (trade name), 50 μm in thickness, manufactured by DAIKIN INDUSTRIES, Ltd.) was used as the resin film and subjected to the fluorination treatment under the conditions shown in Table 7 below.

After the fluorination treatment, the obtained ETFE film was washed with UPW (ultrapure water) under stirring at room temperature for 1 hour. After the washing, UPW on the surface was blown off with nitrogen gas, and then the film was dried under reduced pressure at room temperature until the pressure was reduced to 10 Pa or less. The dried ETFE film and a PET film (LUMIRROR S-10 (trade name), 50 μm in thickness, manufactured by TORAY INDUSTRIES, INC.) were bonded together with a urethane adhesive (PANDO 156A (trade name) manufactured by ThreeBond Co., Ltd.). The bonding was performed by allowing them to stand at a temperature of 25° C. under the atmospheric pressure for 24 hours. Thus, a laminated film according to this example was obtained.

Comparative Example 7

In this comparative example, an ETFE film and a PET film are bonded together with a urethane adhesive interposed therebetween as in Example 17, except that the ETFE film, which was the same as used in Example 17, was not subjected to the fluorination treatment, so that a laminated film according to this comparative example was obtained.

TABLE 7

| | | Fluorination treatment conditions | | | |
|---|---|---|---|---|---|
| | Resin film | Gas type | Concentration (vol %) | Temperature (° C.) | Time (sec) | Peel strength (N/cm) |
| Example 17 | ETFE | $F_2/N_2/O_2$ | 0.5/4.5/95 | 100 | 10 | 1.3 |
| Comparative Example 7 | ETFE | — | — | — | — | 0.05 |

Example 18

In Example 18, a laminated film according to Example 18 was prepared as in Example 17, except that a PVF film (Tedlar (trade name), 50 μm in thickness, manufactured by DuPont)) was used as the resin film and that the fluorination treatment was performed under the conditions shown in Table 8 below.

Comparative Example 8

In this comparative example, a PVF film and a PET film were bonded together with a urethane adhesive interposed therebetween as in Example 17, except that the PVF film, which was the same as used in Example 18, was not subjected to the fluorination treatment, so that a laminated film according to this comparative example was obtained.

TABLE 8

| | | Fluorination treatment conditions | | | |
|---|---|---|---|---|---|
| | Resin film | Gas type | Concentration (vol %) | Temperature (° C.) | Time (sec) | Peel strength (N/cm) |
| Example 18 | PVF | $F_2/N_2/O_2$ | 0.5/4.5/95 | 100 | 10 | 2.5 |
| Comparative Example 8 | PVF | — | — | — | — | 1.2 |

Example 19

In Example 19, a PI film (Kapton (trade name), 45 μm in thickness, manufactured by DuPont) was used as the resin film, and the fluorination treatment was performed under the conditions shown in Table 9 below. A laminated film according to Example 19 was prepared as in Example 17, except that a synthetic rubber adhesive (ThreeBond 1521 (trade name) manufactured by ThreeBond Co., Ltd.) was used as the adhesive.

Comparative Example 9

In this comparative example, a PI film and a PET film were bonded together with a synthetic rubber adhesive interposed therebetween as in Example 17, except that the PI film, which was the same as used in Example 19, was not subjected to the fluorination treatment, so that a laminated film according to this comparative example was obtained.

TABLE 9

| | | Fluorination treatment conditions | | | |
|---|---|---|---|---|---|
| | Resin film | Gas type | Concentration (vol %) | Temperature (° C.) | Time (sec) | Peel strength (N/cm) |
| Example 19 | PI | $F_2/N_2/O_2$ | 0.5/4.5/95 | 30 | 300 | 8.6 |
| Comparative Example 9 | PI | — | — | — | — | 7.2 |

Example 20

A PET film that was subjected to the fluorination treatment as in Example 12 was placed between a pair of PVF films that were subjected to the fluorination treatment as in Example 11, and an untreated ethylene-vinyl acetate copolymer film was placed between each pair of layers, and they are bonded together by heat-pressure bonding. The bonding was performed by pressure bonding under the conditions of a temperature of 135° C. and a pressure of 2.5 kPa for 30 minutes. Subsequently, the product was taken out of the apparatus and allowed to naturally cool to room temperature. Thus, a solar battery back sheet according to this example was obtained, which was composed of five layers and had a peel strength of 20 N/cm or more between PVF and EVA and a peel strength of 25 N/cm or more between PET and EVA. The peel strength was measured by the same method as in the peel test shown below.

(Peel Test)

A peel test was performed on the laminated films according to Examples 1 to 16 and Comparative Examples 1 to by measuring the adhesive power for peeling (peel strength) when the resin film was peeled off from the ethylene-vinyl acetate copolymer film. A peel test was also performed on the laminated films according to Examples 17 to 19 and Comparative Examples 7 to 9 by measuring the adhesive power for peeling (peel strength) when the resin film was peeled off from the PET film. The peel test was performed according to JIS K 6854-1 (90 degree peel). The conditions were a temperature of 25° C., a relative humidity of 20 to 50% Rh, a grip moving speed of 50 mm/minute, and a sample (laminated film) width of 1 cm. The results are shown in Tables 1 to 9.

DESCRIPTION OF REFERENCE CHARACTERS

1: first supply line
2: second supply line
3: third supply line
4: reaction vessel
5: resin film
6: exhaust line
7: vacuum line
8: resin film

The invention claimed is:

1. A method for producing a laminated film comprising at least two resin films laminated together, which comprises:
   a step providing two resin films to form the laminated film, wherein one of the two resin films is an ethylene-vinyl acetate copolymer film;
   a fluorination treatment step comprising bringing a treatment gas comprising a fluorine atoms-containing gas in a concentration of 0.001 to 99.0 vol % and an oxygen atoms-containing gas in a concentration of 0.001 to 99.0 vol % into contact with at least a partial region of a surface of at least one of the two resin films for a treatment time of 1 second to 600 minutes at a treatment temperature of −50° C. to 150° C. to increase the adhesiveness of the region;

a cleaning step comprising cleaning the resin film(s) contacted with the fluorine and oxygen atoms-containing treatment gas in the fluorination treatment step, with a cleaning liquid before bonding the two resin films together to remove unreacted $F_2$, which adsorbs on the surface of the resin film(s), and HF, which is produced in the fluorination treatment step; and a bonding step comprising bonding, without using an adhesive, the two resin films together using, as a bonding surface, the surface that has been brought into contact with the treatment gas, wherein at least one resin film processed in the fluorination treatment step contains different resin components each having a reactive group that is reactive with the treatment gas to increase adhesiveness between the two resin films.

2. The method according to claim 1, wherein the resin film, other than the resin film constituted by the ethylene-vinyl acetate copolymer film, used to form the laminated film is at least one selected from the group consisting of a fluororesin film, a poly(methyl methacrylate) film, a polyethylene terephthalate film, a polyethylene naphthalate film, a polybutylene terephthalate film, a polycyclohexanedimethanol terephthalate film, a polycarbonate film, an ethylene-vinyl acetate copolymer film, a polyolefin-based film, a polyvinyl butyral film, and a polyimide film.

3. A solar battery back sheet comprising a laminated film comprising at least two resin films laminated together obtained by the method according to claim 1, wherein one of the two resin films is an ethylene-vinyl acetate copolymer film, at least a partial region of a surface of at least one of the two resin films is fluorination-treated by bringing a fluorine and oxygen atoms-containing treatment gas into contact with the partial region of the surface of at least one of the two resin films, which partial region of the surface is a roughened surface on which substituent groups contributable to adhesion are provided, the two resin films are bonded together using the roughened surface as a bonding surface, no adhesive is present between the two resin films, and the resin film having the roughened surface contains different resin components each having a reactive group that is reactive with the treatment gas.

4. A solar battery back sheet comprising a laminated film comprising at least two resin films laminated together obtained by the method according to claim 1, wherein one of the two resin films is an ethylene-vinyl acetate copolymer film, at least a partial region of a surface of at least one of the two resin films is fluorination-treated by bringing a fluorine and oxygen atoms-containing treatment gas into contact with the partial region of the surface of at least one of the two resin films, which partial region of the surface is a roughened surface on which substituent groups contributable to adhesion are provided, the two resin films are bonded together using the roughened surface as a bonding surface, no adhesive is present between the two resin films, the resin film, other than the resin film constituted by the ethylene-vinyl acetate copolymer film, used to form the laminated film is at least one selected from the group consisting of a fluororesin film, a poly(methyl methacrylate) film, a polyethylene terephthalate film, a polyethylene naphthalate film, a polybutylene terephthalate film, a polycyclohexanedimethanol terephthalate film, a polycarbonate film, an ethylene-vinyl acetate copolymer film, a polyolefin-based film, a polyvinyl butyral film, and a polyimide film, and the resin film having the roughened surface contains different resin components each having a reactive group that is reactive with the treatment gas.

5. The method according to claim 1, wherein the ethylene-vinyl acetate copolymer film contains an organic peroxide.

* * * * *